United States Patent [19]

Pulice

[11] Patent Number: 5,270,533
[45] Date of Patent: Dec. 14, 1993

[54] STABILIZATION BIASING CIRCUIT FOR AVALANCHE PHOTODIODES

[75] Inventor: Gerald F. Pulice, Skillman, N.J.

[73] Assignee: Smiths Industries, N.J.

[21] Appl. No.: 902,928

[22] Filed: Jun. 23, 1992

[51] Int. Cl.⁵ .............................................. H01J 40/14
[52] U.S. Cl. ........................... 250/214 R; 250/214 C; 307/491
[58] Field of Search ............... 250/214 R, 214 C, 238; 307/310, 311, 491

[56] References Cited

U.S. PATENT DOCUMENTS

| 4,153,835 | 5/1979 | Lau et al. | 250/214 C |
| 4,292,514 | 9/1981 | Ohtomo | 250/214 C |
| 4,438,348 | 3/1984 | Casper et al. | 250/214 C |
| 4,467,192 | 8/1984 | Velo | 250/214 A |
| 4,952,795 | 8/1990 | Gauthier et al. | 250/214 A |

*Primary Examiner*—David C. Nelms
*Assistant Examiner*—Stephone B. Allen
*Attorney, Agent, or Firm*—Anthony J. Casella; Gerald E. Hespos

[57] ABSTRACT

A stabilization biasing circuit is provided for an avalanche photodiode. The stabilization biasing circuit allows for a wide range of light levels to be inputted to the avalanche photodiode, while the avalanche photodiode operates under extreme temperatures. The stabilization biasing circuit also provides for an automatic gain control, thereby enabling the electrical output signal of an avalanche photodiode to be relatively constant over a large range of inputted light levels and temperatures. Absence of optical input is identified as an increase in diode noise due to avalanche breakdown.

8 Claims, 2 Drawing Sheets

STABILIZATION BIASING CIRCUIT FOR AVALANCHE PHOTODIODES

BACKGROUND OF THE INVENTION

Prior art photodiodes are operative to convert optical signals into electrical signals. For example, prior art photodiodes are commonly used in the fiber-optic industry where they are placed at the end of an optical fiber communications network and serve as the interface between the electrical and optical circuits. An avalanche photodiode is a type of prior art photodiode that has a very high light sensitivity, and that can provide extremely accurate electrical signal representations from very small inputted light signals. The prior art avalanche photodiode may produce an increase of ten or more decibels of sensitivity over other prior art means for converting optical signals to electrical signals. The added sensitivity provided by the prior art avalanche photodiode enables increases of optical length and/or bandwidth.

Prior art avalanche photodiodes typically rely on the effect of a voltage breakdown across a reverse-biased p-n biased end junction. This voltage breakdown produces holes and electrons within the substrate of the prior art avalanche photodiodes.

The prior art avalanche photodiode uses both a special doping profile and a high voltage bias to achieve electrical signal amplification within a light sensitive material. The incoming photons of light operate to free electrons within the semi-conducting substrate of the prior art avalanche photodiode. The high voltage bias of the prior art avalanche photodiode then sweeps these electrons so rapidly through the special doping profile of its substrate that collisions between electrons and the semi-conductive substrate in the avalanche photodiode serve to liberate additional electrons. This process is self-multiplying, such that a few input photons of light cause many electrons to flow as the output of the prior art avalanche photodiode.

The avalanche process within a prior art avalanche photodiode is temperature dependent, and hence temperature stabilization methods often are required in prior art avalanche photodiode applications. Prior art avalanche photodiodes have not been extensively used in military or aerospace applications, because these environments tend to have extreme temperatures which may adversely affect the avalanche photodiode biasing point.

Prior art stabilization circuits for avalanche photodiodes typically include a controllable constant voltage source with current limiting and a matched pair of avalanche photodiodes. The voltage drop across one avalanche photodiode acts as a bias reference. This voltage source then is used to bias the other photodiode in the prior stabilization circuit. However, tracking between the two diodes is imperfect and is unable to optimize optical sensitivity in extreme temperature conditions, such as the temperature conditions encountered in military and aerospace environments. Thus, avalanche photodiodes which rely on the prior art stabilization circuit do not achieve optimum performance at temperature extremes. Moreover, matching a pair of photodiodes for bias purposes, as in the prior art stabilization circuit, is both difficult and expensive. Hence, the prior art stabilization circuit for the avalanche photodiode was prone to numerous deficiencies.

Accordingly, an object of the subject invention is to avoid self-destruction of the prior art avalanche photodiode in environments subject to a wide temperature range by limiting diode current.

It is a further object of the subject invention to modulate the operating point of the avalanche photodiode and thereby making the high sensitivity of avalanche photodiodes usable over a wide range of electrical and environmental conditions.

A further object of the present invention is to provide a means in which the photodiode is to be utilized in extreme temperature environments.

SUMMARY OF THE INVENTION

The subject invention is directed to a stabilization biasing circuit for an avalanche photodiode. The stabilization biasing circuit of the subject invention operates to optimize the current flow in an avalanche photodiode. Furthermore, the stabilization biasing circuit for avalanche photodiodes in accordance with the subject invention continuously adjusts the avalanche photodiode voltage to a value just below the avalanche breakdown point. In this manner, the subject stabilization biasing circuit for an avalanche photodiode allows the high optical sensitivity of the avalanche photodiode to be realized over an extreme temperature range of at least $-55°$ C. to $+125°$ C.

The stabilization biasing circuit of the subject invention is comprised of a constant current generator (bias source), a supply of constant voltage and a DC free optical channel code. The constant current bias source is comprised of a constant voltage source, a source resistor and a field effect transistor (FET). The subject stabilization biasing circuit further includes an avalanche photodiode which functions to produce an accurate bias for itself. The avalanche photodiode of the subject invention also operates as an optical/electrical receiver.

The constant current source of the subject stabilization biasing circuit is designed to have its voltage compliance level greater than the highest voltage breakdown point of the avalanche photodiode. This normally is at the lowest operating temperature. The voltage compliance level is achieved in the constant current source by having the FET operate in conjunction with a constant voltage source which is connected to its gate terminal, while the source terminal of the FET is connected to the source resistor. The typical voltage compliance level of the subject stabilization biasing circuit for avalanche photodiodes is approximately 225 volts, while the current flow is approximately 2 microamperes. The constant current source operates to produce an accurate bias level for the avalanche photodiode until either the current in the avalanche photodiode begins to flow due to a converted optical signal input, or an avalanche breakdown begins in the substrate of the avalanche photodiode. Hence, the subject stabilization biasing circuit prevents an avalanche breakdown from occurring when an optical signal is present since the current flow in the avalanche photodiode is limited sufficiently to avoid reaching the avalanche breakdown point. The average value of the photodiode current in the subject invention is held equal to the constant current source, thus allowing for variations in the average value of the optical signal to modulate the instantaneous diode current, which is the system's output.

The subject invention additionally includes an optical channel code having no DC component and a light wave form to have a nearly constant, 50% duty cycle. Examples of nearly DC free channel code includes, for digital systems, a scrambling code, such as the 8 into 14, and for analog systems, square wave constant duty cycle frequency modulation. The DC free channel code is necessary to prevent the avalanche photodiode voltage from tracking the average light level, thereby preventing corruption of the threshold between ones and zeros in the output voltage of the avalanche photodiode.

The constant current bias source has an additional advantage over the prior art constant voltage source, in that the average value of the output current is held approximately equal to the value of the constant current bias source, which is approximately 1-2 microamperes, thus achieving an automatic gain control. In the absence of optical input, avalanche breakdown begins, which can be used as a loss of signal indication.

In summary, the subject invention allows for a wide range of light levels to be inputted to the avalanche photodiode operating under extreme temperatures, while the electrical output of the photodiode is held relatively constant. The subject invention also provides for an automatic gain control effect, thereby keeping the electrical output signal relatively constant over a large range of inputted light levels.

DETAILED DESCRIPTION OF THE PREFERRED EMBODIMENT

Figure 1:
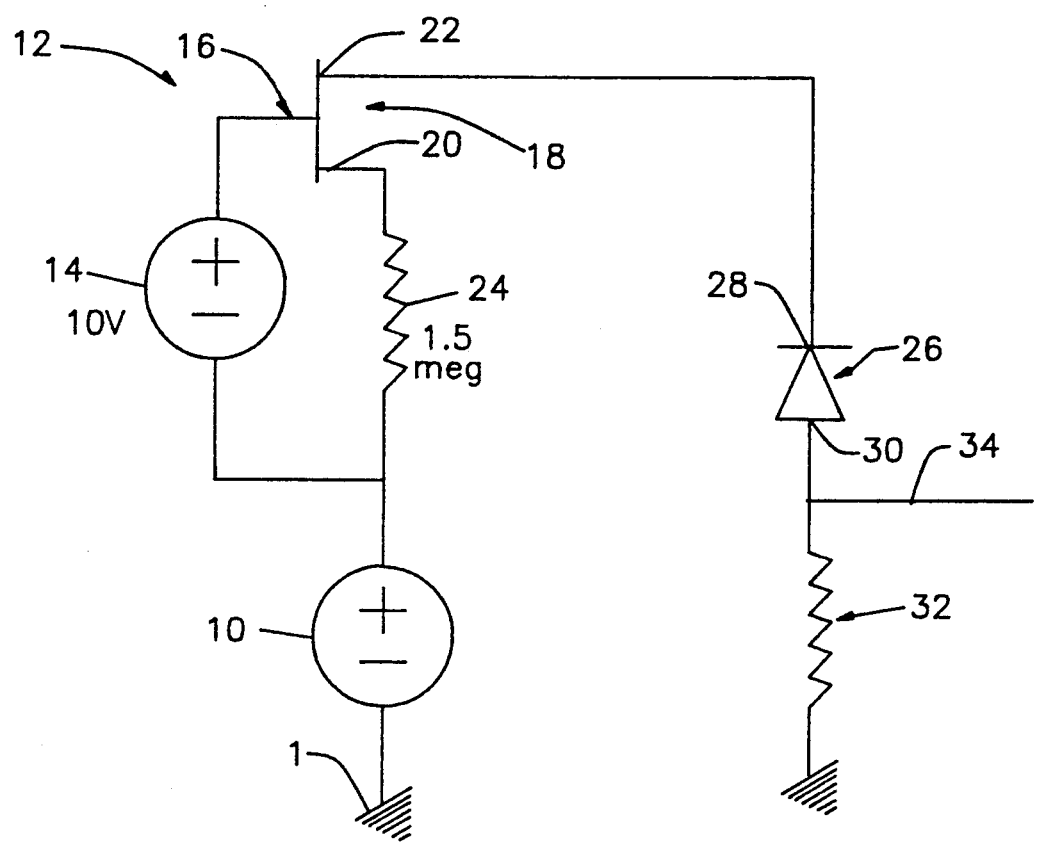
FIG. 1 is a schematic illustration of a stabilization biasing circuit for an avalanche photodiode in accordance with the subject invention.

The stabilization biasing circuit for avalanche photodiodes in accordance with the subject invention is illustrated in FIG. 1 and comprises a first constant voltage source 10, a constant current source 12, an avalanche photodiode 26, a first resistor 32 and a DC free channel code 34.

The biasing circuit of the subject invention is constructed such that, the first constant voltage source 10 has a typical value of 225 volts and is connected in series between the ground 1 and a constant current source 12.

The constant current source 12 has a typical value of 2 microampere and comprises a second constant voltage source 14, a field effect transistor (FET) 18 and a second resistor 24. The second constant voltage source 14 has a typical value of 225 volts, and the second resistor 24 has a typical value of 1.5 mega ohms. The constant current source 12 is connected to the first constant voltage source 10 and to a gate terminal 16 of the FET 18. The second resistor 24 is connected to the first constant voltage source 10 and to a source terminal 20 of the FET 18. The constant current source 12 also is connected through a drain terminal 22 of the FET 18 to a cathode 28 of the avalanche photodiode 26. An anode 30 of the avalanche photodiode 26 is connected to both the DC free channel code 34 and the first resistor 32. The first resistor 32 has a typical value of 1000 ohms and has one terminal connected to both the DC free channel code 34 and to the anode 30 of the avalanche photodiode 26. The other terminal of the first resistor 32 is connected to the ground.

Figure 2:
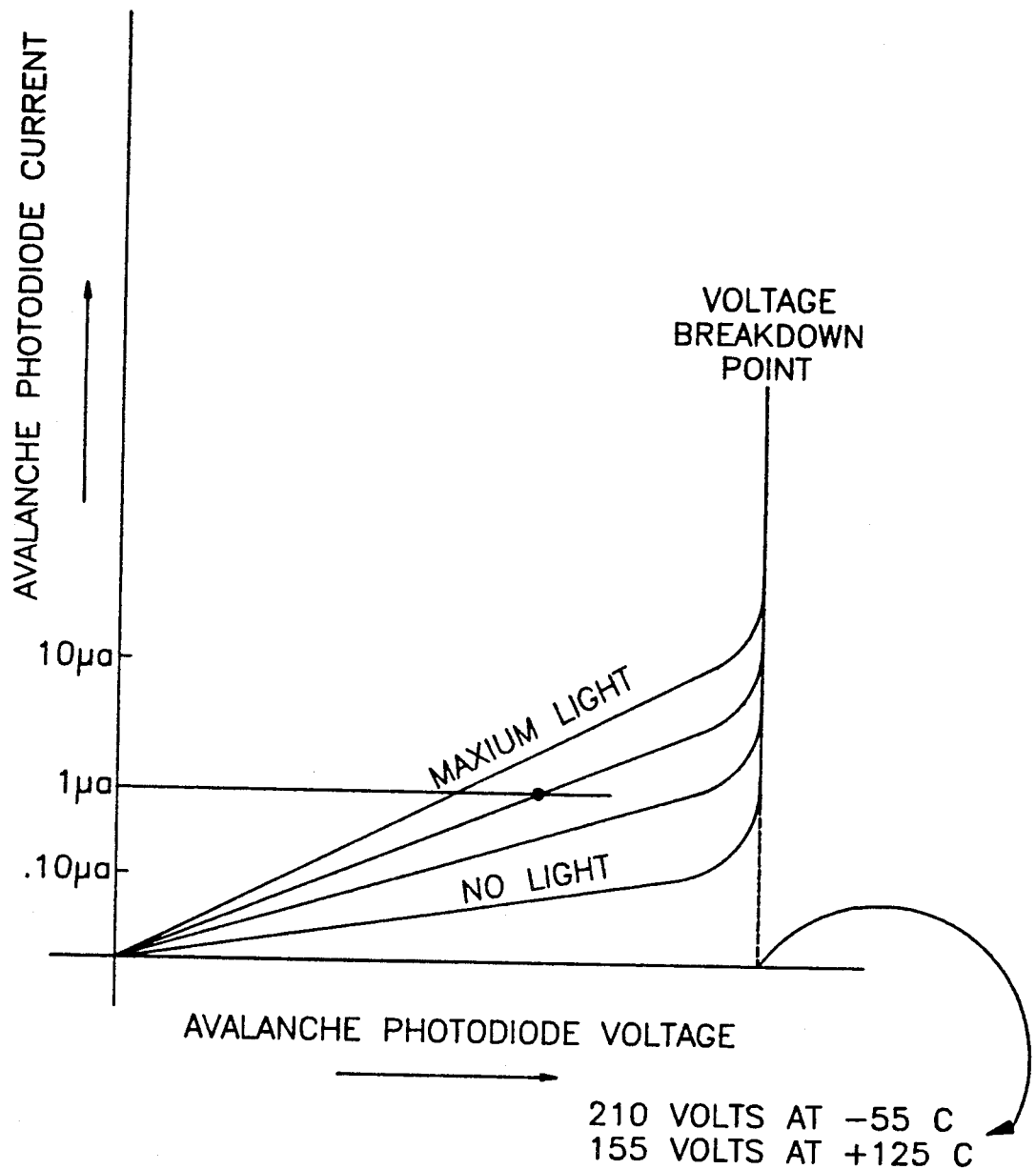
FIG. 2 is a graphic illustration of voltage and current of an avalanche photodiode.

Since the avalanche photodiode 26 is temperature dependent, the avalanche breakdown point of the avalanche photodiode 26 is similarly temperature dependent. With reference to FIG. 2, the avalanche photodiode 26 has an avalanche breakdown point 36 at 210 volts when the temperature is $-55°$ C., and has an avalanche breakdown at 155 volts when the temperature is $+125°$ C.

The substrate within the avalanche photodiode 26 is a light-sensitive material and thus incoming photons of light serve to free electrons within the substrate of the avalanche photodiode 26. These electrons experience numerous collisions with the semiconductor of the avalanche photodiode, causing many other electrons to be free, thus a self-multiplying chain reaction starts to develop within a substrate of the avalanche photodiode 26. FIG. 2 shows the diode voltage versus diode current, with an optical input as a parameter.

Current limiting is employed in the subject stabilization biasing circuit for an avalanche photodiode to prevent the photodiode 26 from self-destructing due to an unlimited current flow caused by the self-multiplying reaction in the substrate of the avalanche photodiode 26. The constant current source 12 of the subject invention limits the current in the avalanche photodiode 26 to be approximately 2 microampere, as shown in FIG. 2. The constant current source 12, is therefore used as a bias for the avalanche photodiode 26. With the constant current source 12, both the avalanche photodiode voltage and the avalanche photodiode current can be stabilized irrespective of the input light signal, as shown illustrated in FIG. 2.

Because the average value of the converted light signal (diode current) is held equal to the constant current source 12, variations in the average value of the optical signal would have a tendency to modulate the diode voltage. Such modulation could cause the diode voltage to shift, and thus could have the undesirable effect of modulating the output of the avalanche photodiode. The subject invention avoids this modulation of the output voltage of the avalanche photodiode 26 by employing the DC free channel code 34, as shown in FIG. 1.

I claim:

1. A stabilization biasing circuit for an avalanche photodiode comprising: a constant voltage source having positive and negative terminals, the negative terminal of the constant voltage source being connected to ground; a constant current source connected in series with the positive terminal of said constant voltage source; an avalanche photodiode having an anode and a cathode, said cathode being connected in series to said constant current source; a DC-free channel code having a nearly constant 50% duty cycle; and a load resistor, said DC-free channel code and a first terminal of said load resistor both being connected to said anode of said avalanche photodiode, said load resistor having a second terminal connected to the ground; whereby said constant current source forces a constant current to flow in said avalanche photodiode irrespective of optical signal strength and ambient temperature of the diode.

2. A stabilization biasing circuit for an avalanche photodiode as in claim 1, wherein the constant current source comprises a source resistor and a second constant voltage source connected in parallel to one another, said second constant voltage source having positive and negative terminals, said constant current source further comprising a field-effect transistor having a gate terminal, a source terminal and a drain terminal, said gate terminal being connected to the positive terminal of said second constant voltage source, said source terminal being connected to the source resistor, and the drain terminal defining the portion of the constant current source connected to the cathode of the avalanche photodiode.

3. A stabilization biasing circuit for an avalanche photodiode as in claim 1, wherein the constant current source has an output current of approximately 2 microampere.

4. A stabilization biasing circuit for an avalanche photodiode as in claim 1, wherein the first constant voltage source has an output voltage of approximately 225 volts.

5. A stabilization biasing circuit for an avalanche photodiode as in claim 1, wherein the load resistor has a resistance of approximately 1000 ohms.

6. A stabilization biasing circuit for an avalanche photodiode as in claim 1, wherein the avalanche photodiode breaks down at 155 volts when the temperature is approximately +125° C. and at 210 volts when the temperature is approximately −55° C.

7. A stabilization biasing circuit for an avalanche photodiode as in claim 1, whereby the avalanche photodiode has its output current held approximately equal to the average value of said constant current source.

8. A stabilization biasing circuit for an avalanche photodiode as in claim 7, wherein a compliance voltage level in said constant current source is higher than a voltage level correlating to the highest possible avalanche photodiode breakdown point.

* * * * *